(12) United States Patent
Pinnow et al.

(10) Patent No.: US 7,358,520 B2
(45) Date of Patent: Apr. 15, 2008

(54) SEMICONDUCTOR MEMORY CELL, METHOD FOR FABRICATING IT AND SEMICONDUCTOR MEMORY DEVICE

(75) Inventors: Cay-Uwe Pinnow, Munich (DE); Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 351 days.

(21) Appl. No.: 11/075,481

(22) Filed: Mar. 9, 2005

(65) Prior Publication Data

US 2005/0212037 A1    Sep. 29, 2005

(30) Foreign Application Priority Data

Mar. 9, 2004  (DE)  .................. 10 2004 011 430

(51) Int. Cl.
*H01L 29/02*  (2006.01)
*H01L 47/00*  (2006.01)

(52) U.S. Cl. .................. 257/2; 257/3; 257/4; 257/5; 257/326; 257/536; 365/232

(58) Field of Classification Search ................ 257/1–5, 257/326, 536; 365/232
See application file for complete search history.

(56) References Cited

U.S. PATENT DOCUMENTS

| | | | |
|---|---|---|---|
| 2002/0017701 A1* | 2/2002 | Klersy et al. ................ 257/536 |
| 2003/0047765 A1 | 3/2003 | Campbell |
| 2003/0209746 A1* | 11/2003 | Horii .......................... 257/295 |
| 2004/0026686 A1 | 2/2004 | Lung |

FOREIGN PATENT DOCUMENTS

JP         04045584         2/1992

* cited by examiner

*Primary Examiner*—Jerome Jackson
*Assistant Examiner*—Jami M Valentine
(74) *Attorney, Agent, or Firm*—Dicke, Billig & Czaja PLLC

(57) ABSTRACT

A semiconductor memory cell, a method for fabricating it and a semiconductor memory device. A phase change material region of a storage element of the semiconductor memory cell has been or is formed as a lining region of a wall region of a contact recess which passes all the way through an insulation region between a first electrode device and a second electrode device. Furthermore, the space or region of the contact recess which is not taken up by the material region of the storage element has been or is made substantially electrically insulating.

15 Claims, 5 Drawing Sheets

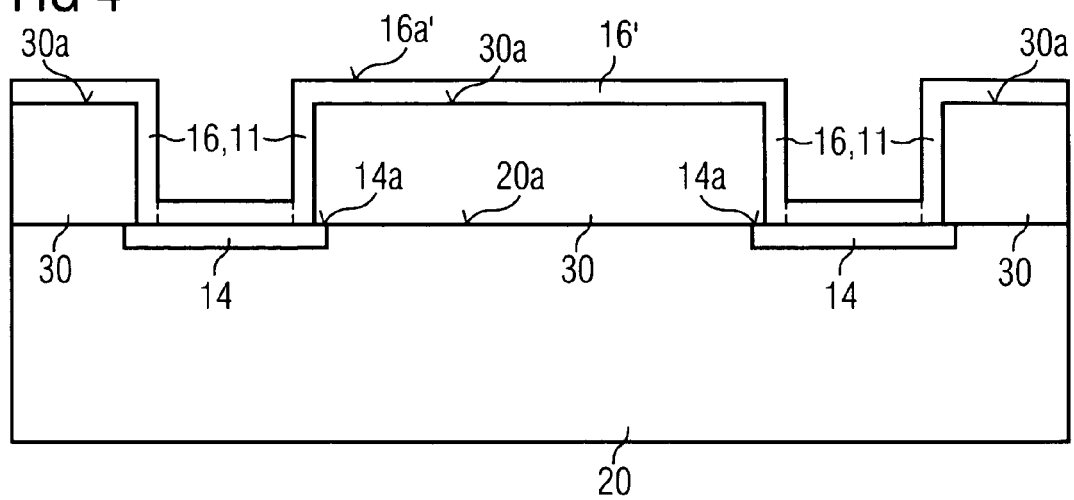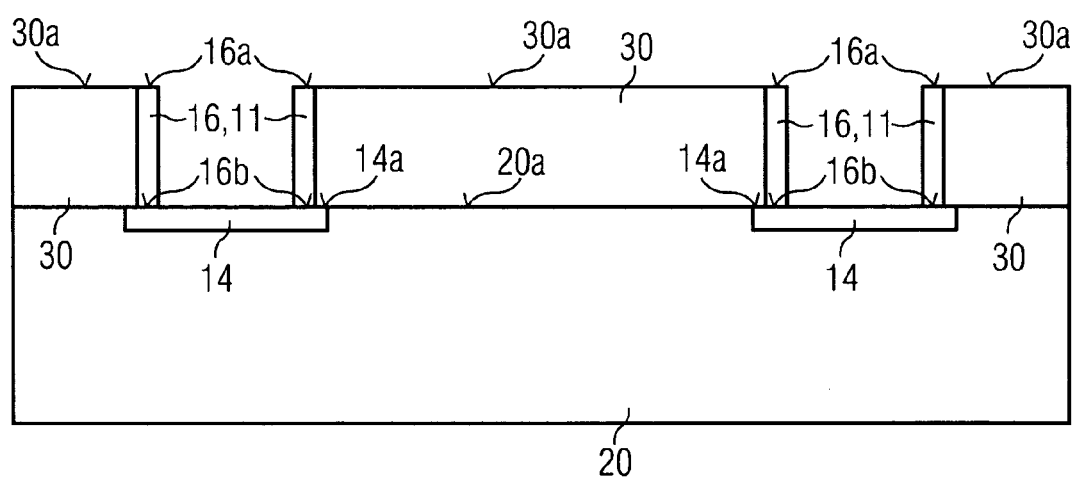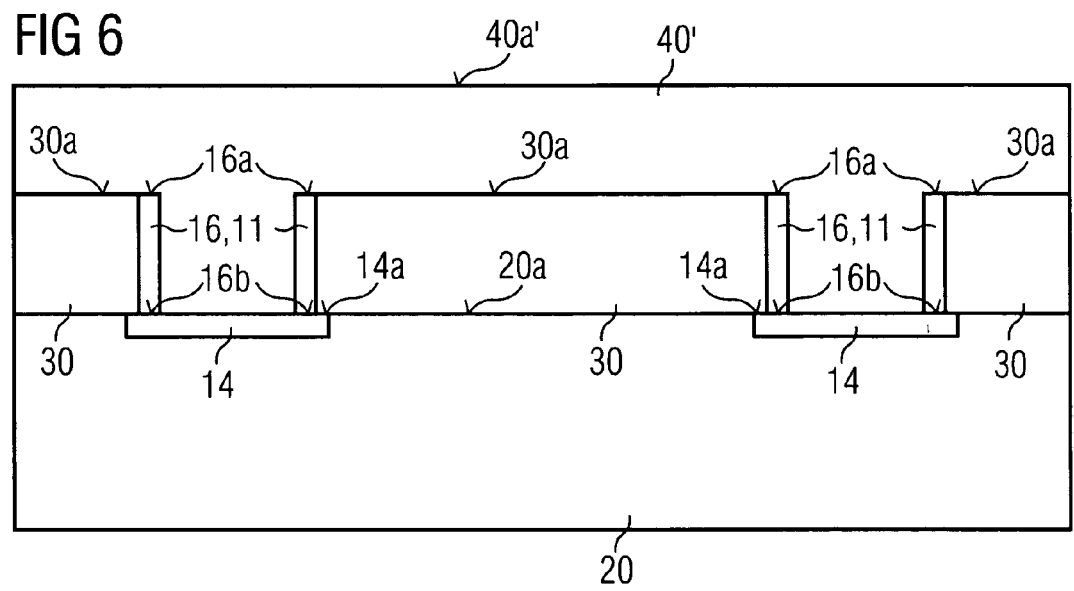

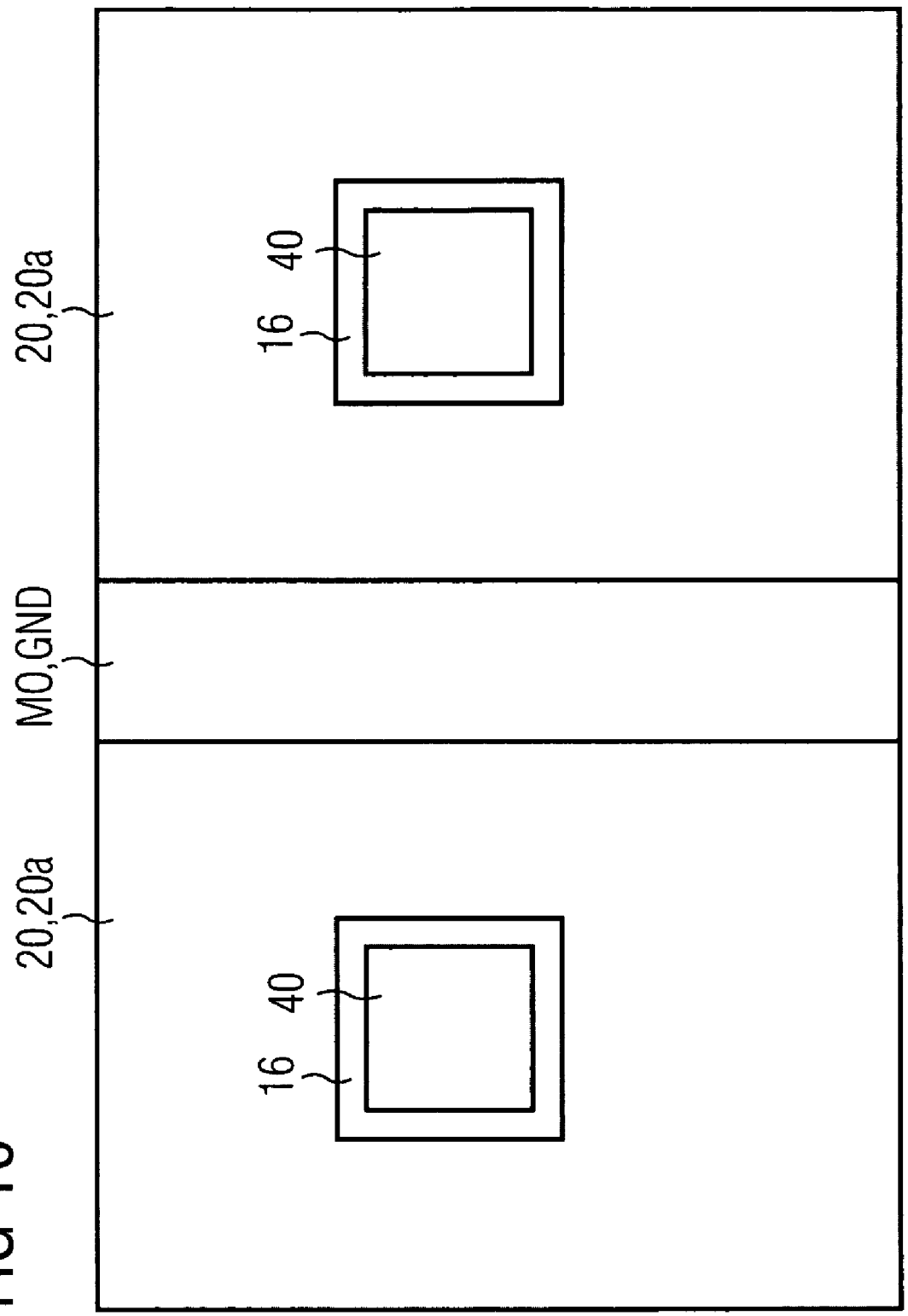

SEMICONDUCTOR MEMORY CELL, METHOD FOR FABRICATING IT AND SEMICONDUCTOR MEMORY DEVICE

CROSS-REFERENCE TO RELATED APPLICATIONS

This Utility Patent Application claims priority to German Patent Application No. DE 10 2004 011 430.7 filed on Mar. 9, 2004, which is incorporated herein by reference.

FIELD OF THE INVENTION

The invention relates to a semiconductor memory cell, to a method for fabricating a semiconductor memory cell and to a semiconductor memory device.

BACKGROUND

In known semiconductor memory cells and methods for fabricating them, a material region of the memory cell, the material of which can adopt a plurality of phases which correspond to different values of a physical variable of the material of the material region of the memory cell and which are or can be assigned to different storage states of the semiconductor memory cell, is or has been provided as the storage element of the semiconductor memory cell, between a first electrode device and a second electrode device and in electrical contact with these electrode devices. The phase state of the storage element is programmed or erased in a suitable way, for example by corresponding heating, when writing and/or erasing the semiconductor memory cell with a phase change storage mechanism, and the storage state and the associated information content are read by determining the value of the physical variable and the corresponding association when reading the semiconductor memory cell.

A problem of known semiconductor memory cells having a phase change storage mechanism is that the electric currents for heating required to program or erase the states of the respective storage elements adopt relatively high levels which cannot readily be delivered by conventional semiconductor circuit arrangements on which they are based and which are customarily used in semiconductor memory devices. This is because firstly the programming or erasing of the respective states of the storage material of the storage elements is effected thermally by a corresponding flow of current through the storage material of the memory cell, and this flow of current is imparted by contact-connection with the first and second electrode devices. Since the geometric or physical extent of the storage material or of the material region of the memory cell has hitherto been limited by the lithographic resolution of the lithography technique used, the currents which are required for thermal programming or erasing do not drop below a defined level, and consequently the underlying circuit arrangements, which also have to realize the programming or erasing, have to be dimensioned accordingly in terms of their electrical power.

Therefore, the overall result is a restriction on the integration density both with regard to the geometric extent of the memory cell itself and with regard to the extent of the semiconductor circuit arrangement on which it is based and which has to realize the programming or erasing processes.

There is a need for a semiconductor memory having a high integration density of phase change memory cells, and a lower programming current.

SUMMARY

The present invention provides a semiconductor memory cell, a semiconductor memory employing the memory cell, and a method of making the semiconductor memory. In one embodiment, the invention provides a semiconductor phase change memory cell having a first electrode device and a second electrode device, an insulation region between the first electrode device and the second electrode device, and a contact recess having a wall region, passing all the way through the insulation region between the first electrode device and the second electrode device. A storage element is provided in electrical contact with the first electrode and the second electrode, the storage element having a material region made of phase change material, wherein the material region of the storage element is formed as a lining region of the wall region of the contact recess, wherein a region of the contact recess which is not taken up by the material region of the storage element is of substantially electrically insulating configuration.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1-9 are lateral cross-sectional views illustrate one embodiment of intermediate states which can be reached during fabrication of a semiconductor memory cell with a phase change storage mechanism according to the invention, in accordance with a preferred embodiment of the fabrication method according to the invention.

FIG. 10 illustrates a diagrammatic plan view of a part of the arrangement illustrated in FIG. 9.

DETAILED DESCRIPTION

Figure 1:
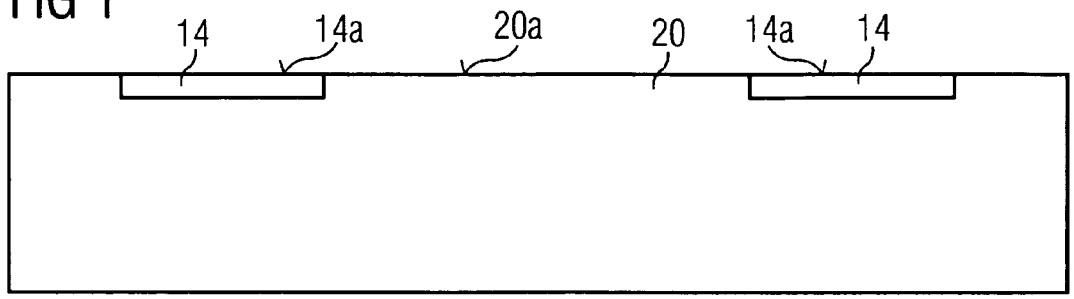

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a semiconductor memory cell with a phase change storage mechanism, a method for fabricating a semiconductor memory cell with a phase change mechanism and a corresponding semiconductor memory device, in which programming or erasing of the storage element of the memory cell can be realized in a particularly simple yet reliable way with a high integration density.

In the semiconductor memory cell with a phase change storage mechanism, a material region of the memory cell, the material of which can adopt a plurality of phases which correspond to different values of a physical variable of the material region of the memory cell and which are or can be assigned to different storage states of the semiconductor memory cell, is provided as the storage element of the semiconductor memory cell, between a first electrode device and a second electrode device and in electrical contact with these electrode devices.

In one embodiment, the semiconductor memory cell with a phase change storage mechanism according to the invention is distinguished in that the material region of the storage element is formed as a lining region of a wall region of a contact recess which passes all the way through an insulation region between the first electrode device and the second electrode device, and wherein the space or region of the contact recess which is not taken up by the material region of the storage element is of substantially electrically insulating design.

Therefore, it is a core concept of the present invention to form the material region of the storage element of the semiconductor memory cell as a lining region of a wall region of a contact recess. For its part, the contact recess is provided in an insulation region between the first electrode device and the second electrode device and runs all the way through this insulation region. Furthermore, it is provided that the space or region of the contact recess which is not taken up by the material region of the storage element is electrically insulating or has an electrically insulating action. Consequently, the lateral or physical extent of the material region of the storage element is not determined by the contact recess, but rather exclusively by the thickness with which the material region that lines the wall region can be formed. The physical extent of the material region of the storage element can be restricted to a greater extent than in the prior art, and consequently a smaller volume of material has to be subjected to a corresponding phase change during programming. As a result, the electric currents which are required for programming can be reduced to a greater extent than in the prior art. The result of this is that the underlying circuit arrangements which have to perform the programming operations can also be designed with smaller dimensions. Consequently, the measure according to the invention makes it possible to achieve a higher integration density of semiconductor memory cells with a phase change mechanism.

In one embodiment of the semiconductor memory cell according to the invention, it is provided that the contact recess is designed as a contact hole.

In another embodiment of the semiconductor memory cell according to the invention, it is provided that the contact recess is designed with a quadrilateral, rectangular, square, round or circular lateral cross section.

Alternatively, the contact recess may also be designed as a trench structure, or a trench as it is known.

To insulate the space or region of the contact recess which is not taken up by the material region of the storage element, this space or region may be formed completely or partially as a cavity.

Alternatively, it is conceivable for the space or region of the contact recess which is not taken up by the material region of the storage element to be completely or partially filled with an insulation material.

To form the material region of the storage element, it is possible to provide for the wall region of the contact recess to be completely or only partially lined with the material of the material region of the storage element.

In another embodiment, the material region of the storage element is designed as a spacer element or as a plurality of spacer elements.

Furthermore, according to the invention it is possible to provide for the material region of the storage element in each case to be designed with a contact surface, which is of sublithographic extent or dimensions, with the first electrode device and/or with the second electrode device.

In another alternative embodiment of a semiconductor memory cell according to the invention, it is provided that the material for the material region of the storage element is a material of which phases correspond to different nonreactive resistances.

Alternatively, it is conceivable for other physical variables rather than the nonreactive resistance to be used as physical variables which characterize the storage states.

A further embodiment of the invention consists in forming a semiconductor memory device in which a plurality of semiconductor memory cells according to the present invention are provided.

A further embodiment of the invention consists in providing a method for fabricating a semiconductor memory cell with a phase change mechanism.

A method of fabricating a semiconductor memory cell with a phase change storage mechanism provides that a material region of the memory cell, the material of which can adopt a plurality of phases which correspond to different values of a physical variable of the material of the material region of the memory cell and which are or can be assigned to different storage states of the semiconductor memory cell, is provided as the storage element of the semiconductor memory cell, between a first electrode device and a second electrode device and in electrical contact with these electrode devices.

In one embodiment, a method according to the invention for fabricating a semiconductor memory cell with a phase change storage mechanism is distinguished in that the material region of the storage element is formed as a lining region of a wall region of a contact recess which passes all the way through an insulation region between the first electrode device and the second electrode device, and wherein the space or region of the contact recess which is not taken up by the material region of the storage element is of substantially electrically insulating design.

In one embodiment of a method according to the invention, it is provided that the contact recess is designed as a contact hole.

In this context, it is particularly advantageous if the contact recess is designed with a quadrilateral, rectangular, square, round or circular lateral cross section.

Furthermore, it is advantageous if, as an alternative to the contact holes, the contact recess is designed as a trench structure or trench.

In another of a method according to the invention, it is provided that the space or region of the contact recess which is not taken up by the material region of the storage element is completely or partially filled with an insulation material.

Alternatively, however, it is also conceivable for the space or region of the contact recess which is not taken up by the material region of the storage element to remain clear, so as to form a cavity structure which has an electrically insulating action.

Furthermore, it is preferable for the wall region of the contact recess to be completely lined by the material region of the storage element.

Alternatively, however, it is also conceivable for only partial regions of the wall region of the contact recess to be lined with the material region of the storage element.

The material region of the storage element may be designed as a spacer element or as a plurality of spacer elements.

It is particularly advantageous if the material region of the storage element is in each case designed with a contact surface, which is of sublithographic extent or dimensions, with the first electrode device and/or with the second electrode device.

The material for the material region of the storage element can be formed or selected as a material of which phases correspond to different nonreactive resistances.

However, it is in principle also possible to select a material, the phases of which correspond to different values of another physical variable.

In one particular embodiment of a method according to the invention for fabricating a semiconductor memory cell with a phase change storage mechanism, it is provided that first of all a carrier having a first electrode device in its surface region is provided and/or formed, that the insulation region having a surface region is then formed on the surface region of the carrier, that the contact recess is then formed at a defined location in or at the insulation region in such a manner that this contact recess extends through the insulation region from the surface region of the insulation region at least to part of the first electrode device and has a wall region, that the wall region of the contact recess or part of it is then lined with the material region of the storage element in such a manner that this material region is in direct or indirect electrical contact with the first electrode device and ends flush with the surface region of the insulation region, and that the second electrode device is then formed in such a manner that this second electrode device is in direct or indirect electrical contact with the material region of the storage element at the surface region of the insulation region.

Furthermore, according to the invention it is advantageous if, in accordance with a preferred embodiment, the material region of the storage element is formed by conformal production, over the entire surface, of a layer of the material of the material region of the storage element, in such a manner that the surface region of the insulation region, the wall regions of the contact recess and the base region of the contact recess are covered, and by subsequent, in particular anisotropic etchback of the layer of the material of the material region of the storage element, in such a manner that the material of the material region of the storage element remains in place only at wall regions of the contact recess but is otherwise removed.

In a further advantageous configuration of the method according to the invention for fabricating a semiconductor memory cell with a phase change storage mechanism, it is provided that the carrier used is a semiconductor material region in which a CMOS circuit arrangement which forms the basis of the semiconductor memory cell is or has been formed, with in particular the first electrode device being designed to be in electrical contact with source/drain regions of selection transistor devices of the underlying CMOS circuit arrangement.

These and further embodiments of the present invention are described in more detail on the basis of the explanations which follow.

In PCRAM memory cells (PCRAM: Phase Change RAM), the amorphous-crystalline phase change of a vitreous material (typically Ge—Sb—Te or Ag—In—Sb—Te compounds) is utilized to store a bit. This makes use of the fact that the amorphous phase and the crystalline phase of these compounds have clear differences in electrical conductivity, these differences typically amounting to two to three orders of magnitude. This difference is exploited in order to determine and read the total resistance of the cell.

The programming to convert a cell which is in the amorphous state into the low-resistance, crystalline phase is effected by using a heating pulse to heat the material to above the crystallization temperature and thereby enabling the material to crystallize. The reverse process, i.e., that of erasing the cell, is realized by heating the material to even above the melting point and then quenching it by rapid cooling into the amorphous, high-resistance state.

One problem here is that very high currents are needed for both the writing operation and in particular also for the erasing operation in order for the phase change medium or PC medium to be heated very quickly and very strongly to above the crystallization point or above the melting point. However, from a technological aspect there are limits on the extent to which a cell of this type can be integrated in a Si CMOS process, and these limits have hitherto prevented successful integration of a compact memory cell.

For example, if the currents which are required in a PCRAM cell of this type are higher than those which can be tolerated by an individual CMOS transistor of minimal feature size, the PCRAM concept loses the possibility of realizing a compact cell array, comprising individual cells which each have one transistor and one resistively switching element (1T1R), in a cell architecture with a cell area of $5\text{-}8F^2$, where F denotes the minimum feature size which can be achieved with a given lithography technology.

The maximum current is approximately 100 µA, and a further reduction would be useful from technological aspects, since the energy consumption is reduced and parallel programming of the cells is made possible, which considerably increases the overall programming speed and therefore the data throughput.

Since the energy which is required for switching a storage element and therefore also the heating current are proportional to the volume of glass converted, it appears a promising prospect to lower the heating currents required by minimizing the dimensions of the glass that is to be converted. This has hitherto been realized by reducing the contact surface area between the metallic heating electrode and the glass by lithographic means.

Attempts have been made to minimize the electrode/phase change glass material contact surface area by using a suitable layout of a PCRAM cell, cf. for example Y. N. Hwang et al., Completely CMOS compatible Phase-Change Nonvolatile RAM Using NMOS Cell Transistors, IEEE Proceedings of the Non-Volatile Semiconductor Memory Workshop, Monterey, 91 (2003).

Examples include structures which can be produced by a spacer process and allow contact surface areas reduced to sublithographic dimensions. A further example is what is known as an edge cell, in which the electrode-glass interface is horizontal in form and the heating currents can be reduced by using a low layer thickness of the electrode, cf. for example G. Wicker, Nonvolatile, High Density, High Performance Phase Change Memory, SPIE Conference on Electronics and Structures for MEMS, Vol. 3891, Queensland, 2 (1999), or also Y. H. Ha, An edge contact cell for Phase Change RAM featuring very low power consumption, Symposia on VLSI technology and VLSI circuits, Conference proceedings (2003), 12B4.

The drawback of the first of the two solutions outlined consists in the fact that the overall current cannot be reduced to a sufficient extent, since the geometric reduction with current lithography generations leads to contact surface areas which require an erase current of typically 1 mA.

The inherent drawback of the second solution mentioned is that on account of the bottom electrode being partially etched at the sides and the phase change material subsequently being deposited, the space which is required for the phase change module and therefore for a memory cell becomes very large, and consequently it is no longer possible for a compact cell of $8F^2$ to be achieved by this concept, which greatly reduces the attractiveness of a resulting product, since the integration density of the product is very limited.

In one embodiment, the present invention provides, inter alia, a process sequence which is CMOS-compatible and is not limited by the resolution of the corresponding lithography. Despite this, it has a considerably better potential for reducing the write and erase currents than the alternatives that have been proposed hitherto, since a considerable reduction in the currents appears possible.

Assuming a 5 nm thick side wall coating thickness of the phase change material and a conservative contact hole of 140 nm×140 nm, which is generally the state of the art in the current 110 nm generation, the result is a contact surface area of 2700 nm$^2$, which is considerably smaller than all data that have been published hitherto and therefore offers the simultaneous advantage of a small, compact cell ($8F^2$) with low programming and erase currents.

One inventive idea in the invention proposed here is that the contact surface area can be reduced to an area which is not determined by the lithography, but rather is at a sublithographic level.

This is achieved by the deposition of the phase change material into an etched contact hole. Any desired process which effects sidewall coverage of the contact hole can be selected for this deposition. Then, by way of example, an anisotropic (dry) etching step is used in order to etch back the phase change material. In the process, the material which is present on the dielectric and in the contact hole base is removed, and only the material which has been deposited at the edge of the contact hole is left in place. For example, in the case of a round shape of the contact hole, this results in a tubular lining of the sides of the contact hole with the deposited phase change material in a thickness which can be set by means of the coating time and the etching process. Conditioning steps may be required to optimize the coverage, forming and stress reduction. Then, the interior of the contact hole is filled with a dielectric material.

The top electrode production and contact-connection can then be carried out after the dielectric has been planarized. This can be done by application and etching of a metal layer or in another variant by means of a Damascene process—e.g., W, Cu or the like.

In the text which follows, elements which are functionally or structurally similar, comparable or equivalent are denoted by the same reference symbols, without a detailed description thereof being repeated each time they occur.

In accordance with the intermediate state of a fabrication method according to the invention illustrated in FIG. 1, first of all a carrier 20 having a surface region 20a is provided or produced, with the first or lower electrode devices 14 or the electrode regions 14 provided—e.g., as MO Metallination—in the region of the surface 20a, the surface region 14a of which electrode devices or regions 14 ends flush with the surface region 20a of the carrier 20.

As has already been mentioned above, the carrier 20 may consist of a semiconductor material region in which a corresponding semiconductor circuit arrangement forming the basis of the switching of the semiconductor memory cells 10 that are to be formed in the semiconductor memory device 100 is included or formed. For clarity, this underlying semiconductor circuit arrangement is not specifically illustrated in the sequence of FIGS. 1 to 8, but is indicated in pure exemplary and diagrammatic form in FIG. 9, and should also be imagined as being included in FIGS. 1 to 8.

Figure 2:
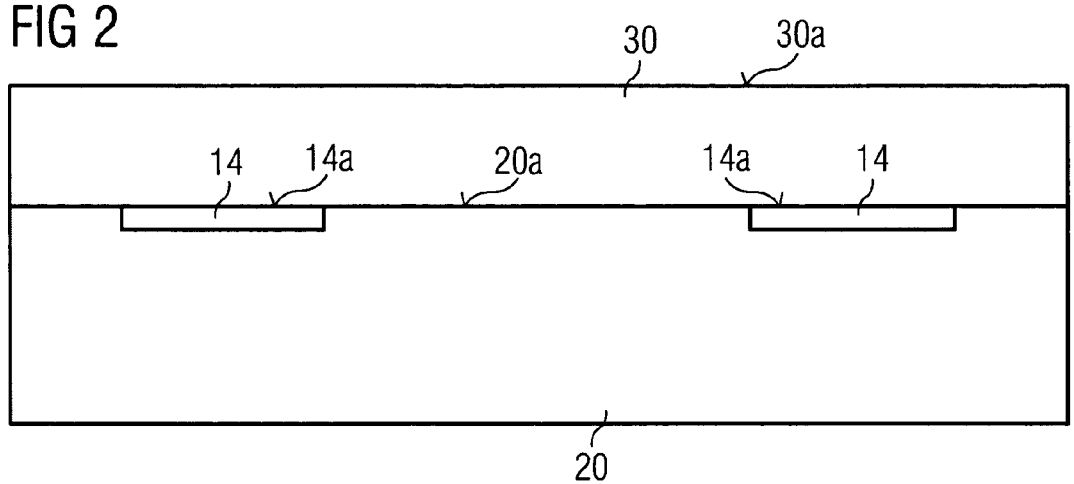

Then, at the transition to the intermediate state illustrated in FIG. 2, a dielectric region 30 having a surface region 30a is formed on the surface region 20a of the carrier 20. This can be done by means of a suitable deposition technique. The dielectric region 30 may also comprise a sequence of one or more layers, for example, a first layer of silicon dioxide and a second layer of silicon nitride above it.

Figure 3:
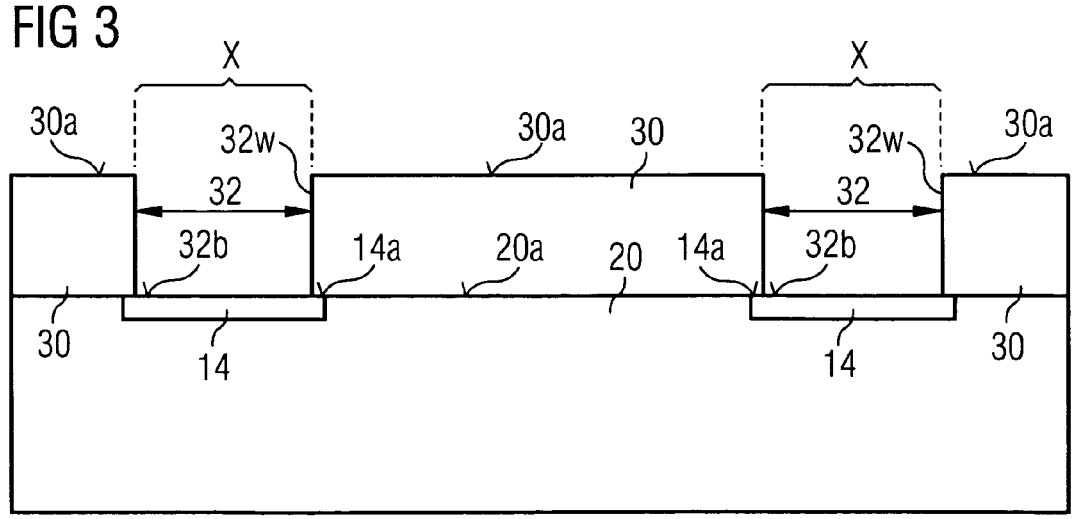

Then, at the transition to an intermediate state illustrated in FIG. 3, a contact recess 32 is formed into the dielectric region 30 or insulation region 30, starting from the surface region 30a thereof, at each of the predefined locations X. The predefined locations X approximately correspond to the positions at which the first electrode devices 14 below are located in the surface region 20a of the carrier 20. The recesses 32 or contact recesses 32, which may also be or have been formed as contact holes, extend from the surface region 30a of the insulation region 30 or dielectric region 30 as far as the surface region 14a of the first electrode devices 14 below and therefore completely pass through the whole of the insulation region 30. The recesses 32 have wall regions 32w and a base region 32b, which at least partially corresponds to the surface region 14a of the first electrode device 14.

Then, at the transition to the intermediate state illustrated in FIG. 4, a layer 16' for the material region 16 for the semiconductor memory cells 10 of the semiconductor memory device 100 that is to be produced is formed conformally on the arrangement shown in FIG. 3, for example by deposition. The material of the layer 16' is a phase change material, for example Ge—Sb—Te. The conformal production of the layer 16' causes the surface regions 30a of the insulation region 30, the wall regions 32w of the recesses or contact recesses 32 and the base regions 32b of the contact recesses 32 to be covered with the material of the layer 16'.

Then, at the transition to the intermediate state illustrated in FIG. 5, an anisotropic etchback process is carried out, which removes the material of the layer 16' on the laterally extending surfaces, i.e., in the example illustrated in FIG. 5 from the surface regions 30a of the insulation region 30 and from the base region 32b of the respective contact recess 32, so that only wall regions 32w of the contact recesses 32 comprising the material of the layer 16' remain in place, with the result that in this way the material regions 16 for the semiconductor memory cells 10 that are to be formed are produced as storage elements 11, offering reduced, relatively small upper and lower contact surfaces 16a and 16b, respectively.

At the transition to the intermediate state illustrated in FIG. 6, a further insulation material 40' or a further dielectric region 40' having a surface region 40a' is deposited two-dimensionally, specifically such that the free spaces which remain in the contact recesses 32 are completely filled, with the result that dielectric plugs 40 with surface region 40a are formed there.

Figure 7:
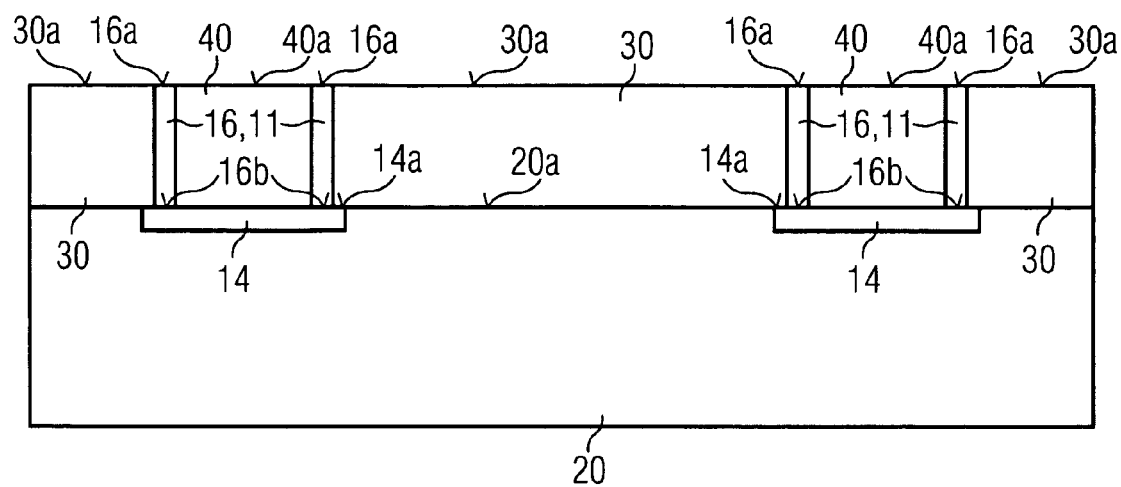

Then, at the transition to the intermediate stage illustrated in FIG. 7, the additional insulation material 40' is caused to recede, for example by chemical-mechanical polishing, stopping at the surface region 30a of the insulation region 30, so that the contact recesses 32 remain filled with the dielectric plugs 40.

Figure 8:
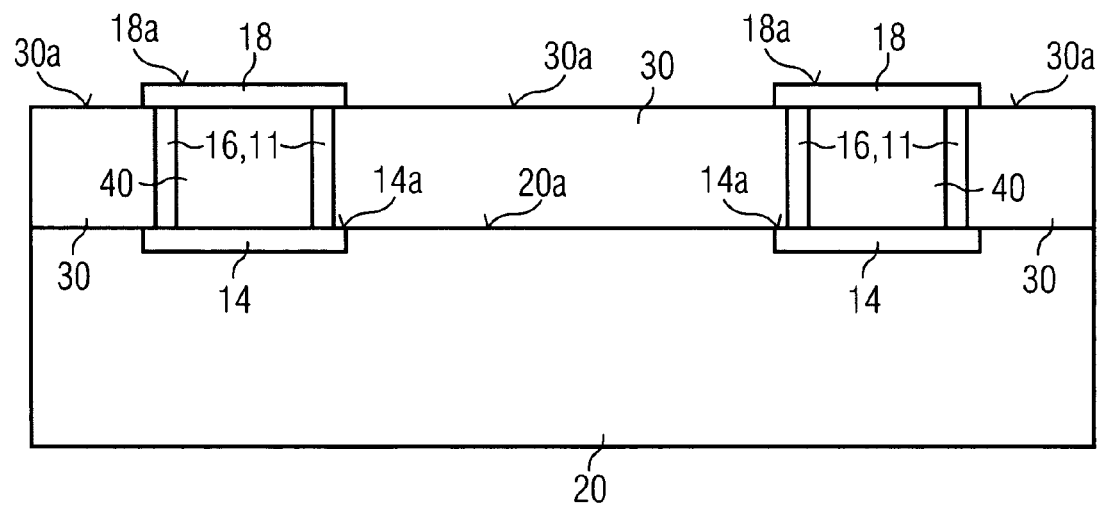

Then, at the transition to the intermediate state illustrated in FIG. 8, the second or upper electrode devices 18 or electrode regions 18 are formed, which in this case are in direct electrical contact, via the upper contact surfaces 16a, with the material regions 16 of the semiconductor memory cells 10, i.e., with the storage elements 11 of the semiconductor memory cells 10.

Figure 9:
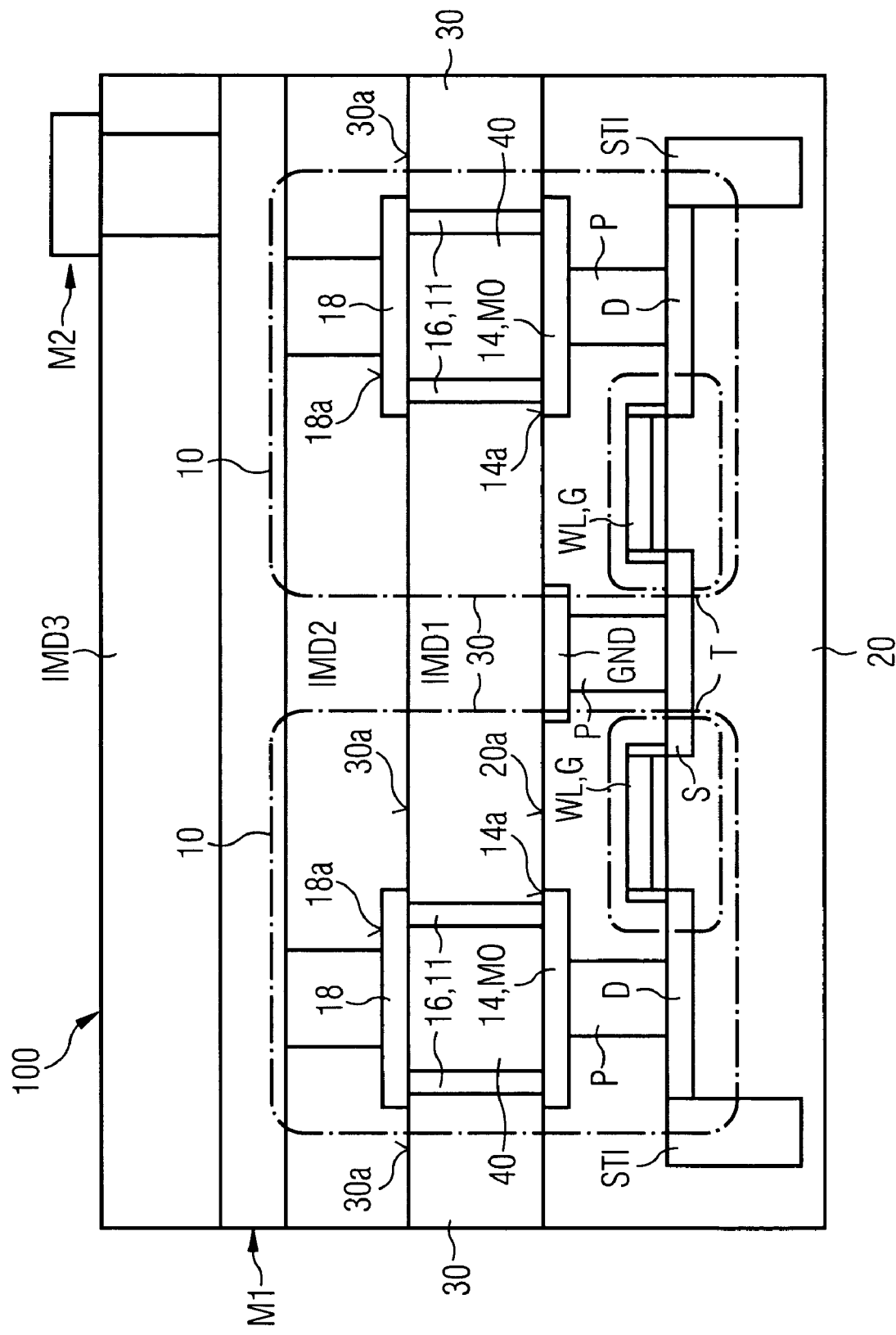

FIG. 9 illustrates one embodiment of a more detailed view of the completed semiconductor memory device 100 according to the invention, in this case with two semiconductor memory cells 10 with a phase change storage mechanism according to the invention. This figure also illustrates that the carrier 20 is designed as a semiconductor material region with a CMOS structure or circuit forming the basic switching arrangement. Selection transistors T are formed by means of word lines WL, which serve as gate electrodes G, and by means of source/drain regions S and D, respectively, which are provided. The drain regions are each electrically conductively connected to structures of a 0-metallization level by means of plugs P, these structures forming or including the first or lower electrode devices 14, which may, for example, consist of tungsten.

FIG. 10 illustrates a plan view of the structure illustrated in FIG. 9, specifically in sectional form. This makes it clear that following the anisotropic etchback of the phase change material of the layer 16', i.e., of the material region 16, minimized contact surface areas result on account of the nonconformal coating, resulting here in contact surface areas which are produced on a sublithographic scale and are also of a sublithographic extent between the phase change material of the material region 16 and the first and second electrode regions 14 and 18, respectively, leading to a reduction in the write and erase currents.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor phase change memory cell comprising:
   a first electrode device and a second electrode device;
   an insulation region between the first electrode device and the second electrode device;
   a contact recess having a wall region, passing all the way through the insulation region between the first electrode device and the second electrode device;
   a storage element in electrical contact with the first electrode and the second electrode, the storage element having a material region made of phase change material, wherein the material region of the storage element is formed as a lining region of the wall region of the contact recess only; and
   wherein a region of the contact recess which is not taken up by the material region of the storage element is of substantially electrically insulating configuration.

2. The semiconductor memory cell of claim 1, wherein the contact recess is configured as a contact hole.

3. The semiconductor memory cell of claim 1, wherein the contact recess is configured with a quadrilateral, rectangular, square, round or circular lateral cross section.

4. The semiconductor memory cell of claim 1, wherein the contact recess is configured as a trench.

5. The semiconductor memory cell of claim 1, wherein the region in the contact recess which is not taken up by the material region of the storage element is completely or partially filled with an insulation material.

6. The semiconductor memory cell of claim 1, wherein the wall region of the contact recess is completely lined by the material region of the storage element.

7. The semiconductor memory cell of claim 1, wherein the material region of the storage element is configured as a spacer element.

8. The semiconductor memory cell of claim 1, wherein the contact recess has lithographic dimensions: and
   wherein the material region of the storage element has a contact surface with the first electrode device and/or with the second electrode device, the contact surface having sublithographic dimensions.

9. The semiconductor memory cell of claim 1, wherein the phase change material has phases that correspond to different nonreactive resistances.

10. A semiconductor memory device made of a plurality of semiconductor memory cells, where at least one memory cell comprises:
    a first electrode device and a second electrode device;
    an insulation region between the first electrode device and the second electrode device;
    a contact recess having a wall region, passing all the way through the insulation region between the first electrode device and the second electrode device;
    a storage element in electrical contact with the first electrode and the second electrode, the storage element having a material region made of phase change material, wherein the material region of the storage element is formed as a lining region of the wall region of the contact recess only; and
    wherein a region of the contact recess which is not taken up by the material region of the storage element is of substantially electrically insulating configuration.

11. The semiconductor memory cell of claim 10, wherein the contact recess is configured as a contact hole, and wherein the contact recess is configured with a quadrilateral, rectangular, square, round or circular lateral cross section.

12. The semiconductor memory cell of claim 10, wherein the region in the contact recess which is not taken up by the material region of the storage element is completely or partially filled with an insulation material, and wherein the wall region of the contact recess is completely lined by the material region of the storage element.

13. The semiconductor memory cell of claim 12, wherein the material region of the storage element is configured as a spacer element, wherein the material region of the storage element is configured with a contact surface, having sublithographic dimensions, with the first electrode device and/or with the second electrode device, and wherein the phase change material has phases that correspond to different nonreactive resistances.

14. A semiconductor phase change memory cell comprising:
    a first electrode device and a second electrode device;
    an insulation region between the first electrode device and the second electrode device;
    a contact recess having a wall region, passing all the way through the insulation region between the first electrode device and the second electrode device;
    a storage element in electrical contact with the first electrode and the second electrode, the storage element having a material region made of phase change material, wherein the material region of the storage element is formed as a lining region of the wall region of the contact recess only, the lining region completely covering the wall region of the contact recess; and wherein a region of the contact recess which is not taken up by the material region of the storage element is of substantially electrically insulating configuration.

15. A memory comprising:

a first electrode;

a second electrode;

an insulation material contacting the first electrode and the second electrode; and a phase change material contacting the first electrode and the second electrode, the phase change material laterally surrounding the insulation material.

\* \* \* \* \*